United States Patent [19]
Dennis et al.

[11] Patent Number: 6,020,630
[45] Date of Patent: Feb. 1, 2000

[54] TAPE AUTOMATED BONDING PACKAGE FOR A SEMICONDUCTOR CHIP EMPLOYING CORNER MEMBER CROSS-SLOTS

[75] Inventors: William K. Dennis, Garland; Masood Murtuza, Sugarland, both of Tex.

[73] Assignee: Texas Instruments Incorporated, Dallas, Tex.

[21] Appl. No.: 08/368,926

[22] Filed: Jan. 5, 1995

[51] Int. Cl.[7] ............ H01L 23/48; H01L 23/50; H01L 29/52
[52] U.S. Cl. ............ 257/690; 257/666; 257/668; 257/669; 257/671
[58] Field of Search ............ 257/666, 690, 257/692, 730, 691, 668, 671, 669

[56] References Cited

U.S. PATENT DOCUMENTS

| | | | |
|---|---|---|---|
| 5,008,614 | 4/1991 | Shreeve et al. | 257/668 |
| 5,229,638 | 7/1993 | Ito | 257/666 |
| 5,336,927 | 8/1994 | Suetake | 257/671 |

FOREIGN PATENT DOCUMENTS

| | | | |
|---|---|---|---|
| 0113458 | 5/1987 | Japan | 257/669 |
| 0287937 | 11/1989 | Japan | 257/692 |
| 0269856 | 9/1992 | Japan | 257/666 |

*Primary Examiner*—Alexander Oscar Williams
*Attorney, Agent, or Firm*—Robert D. Marshall, Jr.; Gerald E. Laws; Richard L. Donaldson

[57] ABSTRACT

A semiconductor package (80) is provided that serves to support a semiconductor chip (12). A radial slot (54) is formed in an inner ring (26). Cross-slots (64) and (66) are formed in a corner member (38) of polyimide film (22). The slots (54), (64) and (66) serve to allow independent expansion of various portions of the polyimide film (22) and prevent breakage of contact leads (14), (16), (18) and (20) due to the differences in the thermal coefficient of expansion of the semiconductor material and the polyimide film material.

12 Claims, 2 Drawing Sheets

TAPE AUTOMATED BONDING PACKAGE FOR A SEMICONDUCTOR CHIP EMPLOYING CORNER MEMBER CROSS-SLOTS

TECHNICAL FIELD OF THE INVENTION

This invention relates in general to the field of electronic devices and more particularly to an improved tape automated bonding package for a semiconductor chip and a method of manufacture.

BACKGROUND OF THE INVENTION

One method of packaging integrated circuit chips formed on semiconductor chips is through the use of a polyimide film similar to photographic film that is used as a base for the interconnect wires which are routed from other circuitry to the bond pads on the semiconductor chip. The polyimide films may comprise, for example, Upilex or Kapton. A chip is initially placed in an inner opening in the film and interconnects are routed from the bond pads on the chip to test pads on the periphery of the film. The inner opening is surrounded by an inner polyimide ring. Four outer openings surround the inner polyimide ring. The interconnects are routed from the chip over the inner ring and then over the outer openings to the periphery of the film. The inner ring is coupled to the periphery of the film by four corner members of the polyimide film. After testing, the polyimide film and the interconnects are cut outside of the outer openings and the combination of the film, the interconnects and the chip is mounted to a circuit board so that the chip may be used for its intended purpose.

The leads that are routed from the chip over the film are extremely thin and fragile. The chips are required to operate in environments with dramatically changing temperature. For example, some chips are tested in the temperature range on the order of −65° C. to 150° C. The difference in thermal coefficient of expansion between the film and the semiconductor material such as silicon which is used to form the integrated circuit chip creates stresses on the leads passing from the chip over the film. This stress can be great enough to cause delamination between the leads and the film and in catastrophic cases, breaking of the leads.

For smaller die sizes, the spacing between the integrated circuit chip and the inner ring of polyimide film can be increased to reduce the stress on the leads. However, as die sizes increase, this approach becomes impractical. Accordingly, a need has arisen for a new form of tape automated bonding packaging which eliminates the problems with lead breakage and delamination caused by differences in the thermal coefficient of expansion between the semiconductor material and the film material.

SUMMARY OF THE INVENTION

In accordance with the teachings of the present invention, a tape automated bonding package and method of construction are provided that substantially eliminate or reduce disadvantages associated with prior packaging systems.

According to one embodiment of the present invention, a packaged integrated circuit is provided that comprises a semiconductor chip coupled to a plurality of interconnects extending outward from the bond pads on the semiconductor chip. The package device further comprises an inner ring of polyimide film coupled to the interconnects and surrounding the semiconductor chip. The inner ring of polyimide film is connected to an outer ring of polyimide film by corner members of polyimide film. The outer ring of polyimide film surrounds the inner ring. The inner ring comprises radial expansion slots extending from proximate the corners of the semiconductor chip to proximate the corner members of polyimide films. The radial slots allow the four sides of the inner ring of polyimide film to expand and contract relatively independent of one another.

According to another embodiment of the present invention, the corner connecting members of polyimide film comprise cross-slots formed in the edges of the corner members. The cross-slots allow the inner ring of polyimide material to expand relatively independent of the outer ring of polyimide material.

BRIEF DESCRIPTION OF THE DRAWINGS

A more complete understanding of the present invention and the advantages associated therewith may be acquired by referring to the accompanying drawings in which like reference numbers indicate like features and wherein.

DETAILED DESCRIPTION OF THE INVENTION

Figure 1:
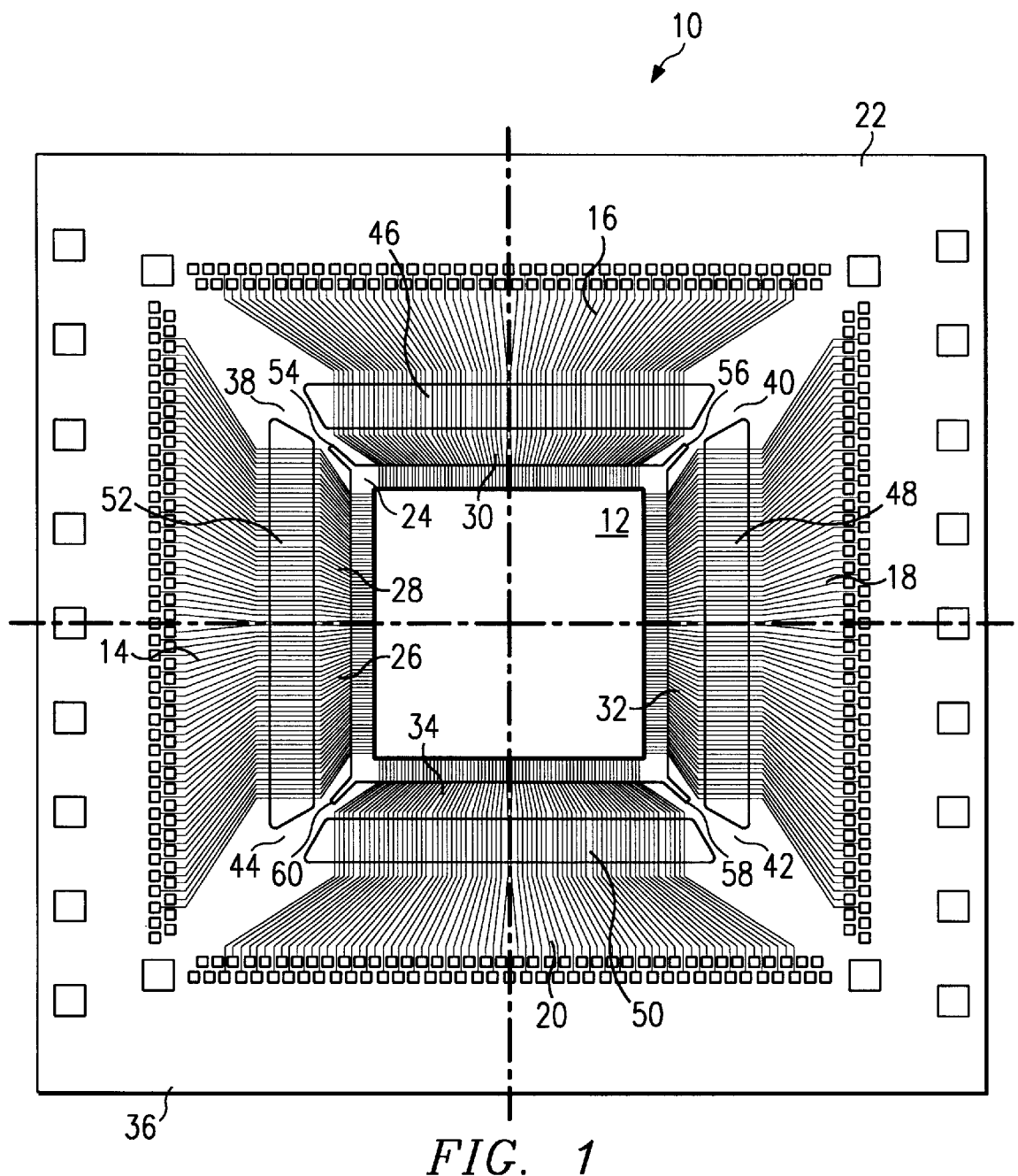
FIG. 1 is a schematic illustration of a tape automated bonding package constructed according to the teachings of the present invention using radial slots in the inner ring of polyimide film.

FIG. 1 is a schematic illustration of a tape automated bonded package 10 which serves to package a semiconductor chip 12. Semiconductor chip 12 is surrounded by four groups of interconnecting leads 14, 16, 18 and 20. Interconnecting leads 14, 16, 18 and 20 are disposed on a surface of a sheet of polyimide film 22. Polyimide film 22 may comprise Upilex, Kapton, or other suitable polyimide film. Interconnecting leads 14, 16, 18 and 20 comprise strips of metal such as gold-plated copper which are defined and formed on the surface of polyimide film 22 using photolithographic processes. One end of each of the interconnects 14, 16, 18 and 20 terminates at and are electrically connected to a bond pad on the surface of semiconductor chip 12.

Semiconductor chip 12 resides in an inner opening 24 in polyimide film 22. Inner opening 24 is defined by an inner ring 26 of polyimide film surrounding semiconductor chip 12. Inner ring 26 comprises four sides 28, 30, 32 and 34. As shown in FIG. 1, side 28 of inner ring 26 serves to support a portion of interconnect leads 14. Similarly, side 30 supports a portion of interconnect lead 16; side 32 supports a portion of interconnect lead 18; and side 34 supports a portion of interconnect leads 20. Inner ring 26 is supported by an outer body 36 of polyimide film 22. Inner ring 26 is connected to outer body 36 through four corner members 38, 40, 42 and 44.

FIG. 1 illustrates package 10 in test mode where each of the interconnects 14, 16, 18 and 20 couple a bond pad on semiconductor chip 12 to a plurality of test pads around the periphery of polyimide film 22. After the semiconductor chip 12 is tested, the polyimide film 22 and the interconnects 14, 16, 18 and 20 will be cut immediately outside of openings 46, 48, 50 and 52, separating inner ring 26 from outer body 36 as shown in FIG. 1. The semiconductor chip 12 and the remaining interconnects 14, 16, 18 and 20 will then be coupled to circuitry on a circuit board using the portion of interconnects passing over openings 46, 48, 50 and 52.

The thermal coefficient of expansion of the silicon material which may be used to form semiconductor chip 12 is on the order of two to three parts per million per degree centigrade. In contrast, the thermal coefficient of expansion of the polyimide film 22 is on the order of 18 parts per million per degree centigrade. As such, during radical changes in temperature sometimes encountered in the operating environment of semiconductor chip 12, polyimide film 22 and semiconductor chip 12 can expand and contract at significantly different rates. This expansion differential places stress on contact leads 14, 16, 18 and 20. In some instances, semiconductor chip 12 is tested to operate over a temperature range from −65° C. to 100° C. During these temperature changes, the contact leads 14, 16, 18 and 20 can delaminate from polyimide film 22 and in the most severe cases, certain leads, especially near the corners of semiconductor chip 12, can break.

According to the teachings of the present invention, the expansion of the polyimide film 22 and especially the expansion of the inner ring 26 is prevented from effecting the contact leads by including radial slots 54, 56, 58 and 60 in the inner ring proximate the corners of the semiconductor chip 12 and the corner connecting members 38, 40, 42 and 44. As shown in FIG. 1, radial slot 54 extends partly through inner ring 26 between side piece 28 and side piece 30 of inner ring 26. Similarly, radial slot 56 extends partly through inner ring 26 between side piece 30 and side piece 32. Radial slot 58 extends partly through inner ring 26 between side piece 32 and side piece 34 and, finally, radial slot 60 extends partly through inner ring 26 between side piece 34 and side piece 28. Radial slots 54, 56, 58 and 60 operate to isolate the expansion and contraction of the four sides 28, 30, 32 and 34 of the inner ring 26 and, as such, prevent stress on the contact leads 14, 16, 18 and 20.

Figure 2:
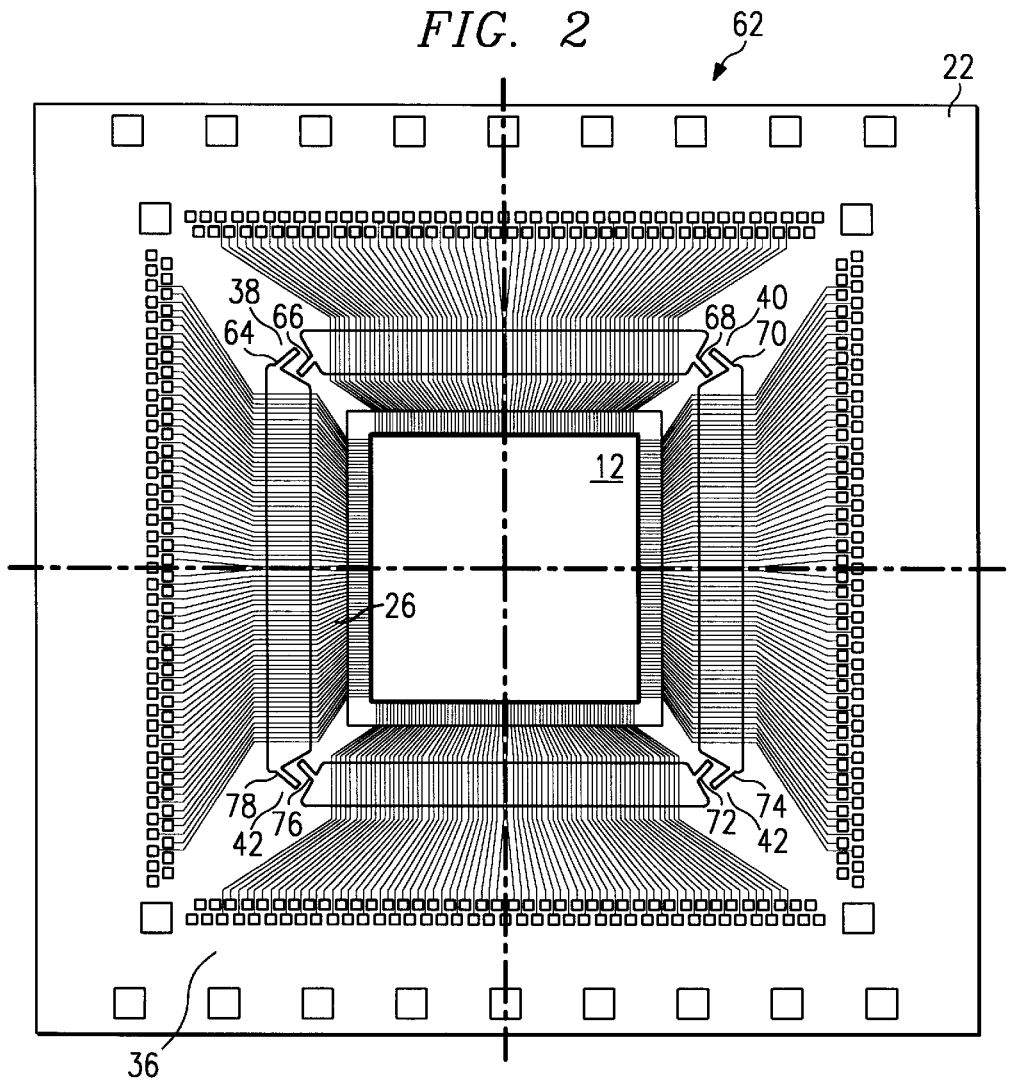
FIG. 2 is a schematic illustration of a tape automated bonding package constructed according to the teachings of the present invention using cross-slots in the corner members of polyimide film.

Referring to FIG. 2, a tape automated bonding package 62 for semiconductor chip 12 is shown. Package 62 contains identical elements to package 10 described with reference to FIG. 1. Particularly, package 62 comprises corner members 38, 40, 42 and 44 which serve to connect inner ring 26 to outer body 36 of polyimide film 22. As shown in FIG. 2, corner member 38 comprises cross-slot 64 and cross-slot 66 which extend from opposite sides of corner member 38 partly into corner member 38. Similarly, corner member 40 comprises identical cross-slots 68 and 70. Corner member 42 comprises cross-slots 72 and 74. Finally, corner member 42 comprises cross-slots 76 and 78. Cross-slots 64 through 78 serve to isolate the expansion and contraction of the inner ring 26 from the expansion and contraction of the outer body 36 of polyimide film 22.

Figure 3:
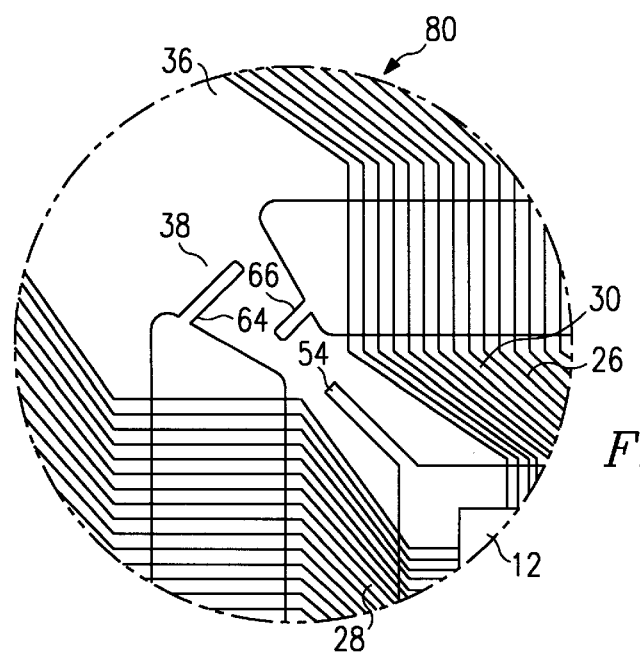
FIG. 3 is an enlarged view of one corner of a tape automated bonding package using both radial slots and cross-slots in the polyimide film surrounding the semiconductor chip.

FIG. 3 is an enlarged view of one corner of a package 80 constructed according to the teachings of the present invention. FIG. 3 illustrates one corner of semiconductor chip 12 which is once again surrounded by inner ring 26. Package 80 utilizes both cross-slots 64 and 66 in corner member 38 and radial slot 54 between side 28 and side 30 of inner ring 26. The combination of both techniques described respectively in FIG. 1 and FIG. 2 serve to completely isolate the expansion and contraction of the inner ring and the outer area 36 of polyimide film 22. FIG. 3 only illustrates one corner of the package 80 for reasons of clarity. It should be understood that similar structures may be formed on each corner of semiconductor chip 12.

An important technical advantage of the present invention inheres in the fact that it allows for the differences in the rate of expansions between the semiconductor material used to form semiconductor chip 12 and the material used for form the portions of the polyimide film 22 used to support the semiconductor chip 12. The radial slots and cross-slots formed proximate the corners of the semiconductor chip 12 allow for the various portions of the polyimide film 22 and semiconductor chip 12 to remain isolated and to expand and contract independently. This independence prevents stress from being translated to the fragile contact leads and prevents delamination or breakage of the leads.

Although the present invention has been described in detail, it should be understood that various changes, alterations and substitutions may be made to the teachings herein without departing from the spirit and scope of the present invention which is solely defined by the appended claims.

What is claimed is:

1. A packaged semiconductor chip comprising:

a semiconductor chip;

a plurality of contact leads electrically connected to the semiconductor chip;

an inner ring of film surrounding the semiconductor chip and supporting a portion of the contact leads;

an outer body of film surrounding the inner ring of film and connected to the inner ring of film by four corner members of film material, the outer body of film supporting a further portion of the contact leads; and each of the corner members comprising at least one cross-slot extending inward from an edge of the corner member partway across the corner member such that stress on the contact leads resulting from the thermal expansion and contraction of the semiconductor chip, the inner ring of film material and the outer body of film material is reduced.

2. The packaged semiconductor chip of claim 1, wherein each corner member comprises two offset cross-slots formed in opposing edges of the corner member, each of the opposing slots extending partway across the corner member toward the opposite edge of the corner member.

3. The packaged semiconductor chip of claim 1 wherein the inner ring of film and the outer ring of film each comprises a polyimide material.

4. A packaged semiconductor chip comprising:

a semiconductor chip;

a plurality of contact leads electrically connected to the semiconductor chip;

an inner ring of film surrounding the semiconductor chip and supporting a portion of the contact leads;

an outer body of film surrounding the inner ring of film and connected to the inner ring of film by four corner members of film material, the outer body of film supporting a further portion of the contact leads; the inner ring comprising radial slots proximate each corner of the semiconductor chip extending partway through the corners of the inner ring of film such that the stress on the contact leads resulting from thermal expansion and contraction of the semiconductor chip and the film material comprising the inner ring of film is reduced; and each of the corner members comprising at least one cross-slot extending inward from an edge of the corner member partway across the corner member such that stress on the contact leads resulting from thermal expansion and contraction of the semiconductor chip, the inner ring of film material and the outer body of film material is further reduced.

5. The packaged semiconductor chip of claim 4, wherein each corner member comprises two offset cross-slots formed in opposing edges of the corner member, each of the opposing slots extending partway across the corner member toward the opposite edge of the corner member.

6. The packaged semiconductor chip of claim 4 wherein the inner ring of film and the outer ring of film each comprises a polyimide material.

7. A packaged semiconductor chip comprising:

a semiconductor chip having four corners;

a plurality of contact leads electrically connected to the semiconductor chip;

a ring of film surrounding the semiconductor chip and supporting a portion of the contact leads, said ring of film including four corner members of film material opposite corners of the semiconductor chip; and each of the corner members comprising at least one cross-slot extending inward from an edge of the corner member partway across the corner member such that stress on the contact leads resulting from the thermal expansion and contraction of the semiconductor chip and the ring of film is reduced.

8. The packaged semiconductor ship of claim 7, wherein each corner member comprises two offset cross-slots formed in opposing edges of the corner member, each of the opposing slots extending partway across the corner member toward the opposite edge of the corner member.

9. The packaged semiconductor chip of claim 7 wherein the ring of film comprises a polyimide material.

10. A packaged semiconductor chip comprising:

a semiconductor chip having four corners;

a plurality of contact leads electrically connected to the semiconductor chip;

a ring of film surrounding the semiconductor chip and supporting a portion of the contact leads, said ring of film including four corner members of film material opposite corners of the semiconductor chip;

each of the corner members comprising radial slots proximate each corner of the semiconductor chip extending partway through the corner members of the ring of film, and at least one cross-slot extending inward from an edge of the corner member partway across the corner member such that stress on the contact leads resulting from thermal expansion and contraction of the semiconductor chip and the ring of film is reduced.

11. The packaged semiconductor chip of claim 10, wherein each corner member comprises two offset cross-slots formed in opposing edges of the corner member, each of the opposing slots extending partway across the corner member toward the opposite edge of the corner member.

12. The packaged semiconductor chip of claim 10, wherein the inner ring of film and the outer ring of film each comprises a polyimide material.

* * * * *